US006377036B1

United States Patent
Takeuchi et al.

(10) Patent No.: US 6,377,036 B1
(45) Date of Patent: Apr. 23, 2002

(54) ELECTRO-OPTIC SAMPLING OSCILLOSCOPE

(75) Inventors: Nobuaki Takeuchi; Yoshiki Yanagisawa; Jun Kikuchi; Yoshio Endou; Mitsuru Shinagawa; Tadao Nagatsuma; Kazuyoshi Matsuhiro, all of Tokyo (JP)

(73) Assignees: Ando Electric Co., Ltd.; Nippon Telegraph and Telephone Corporation, both of Tokyo (JP)

( * ) Notice: Subject to any disclaimer, the term of this patent is extended or adjusted under 35 U.S.C. 154(b) by 0 days.

(21) Appl. No.: 09/167,307

(22) Filed: Oct. 6, 1998

(30) Foreign Application Priority Data

Oct. 6, 1997 (JP) .............................................. 9-273158

(51) Int. Cl.[7] .......................... G01R 13/24; G01R 13/34
(52) U.S. Cl. ...................................... 324/121 R; 324/96
(58) Field of Search .............................. 324/96, 121 R, 324/76.15, 102

(56) References Cited

U.S. PATENT DOCUMENTS

| 2,591,738 | A | * | 4/1952 | Spencer ....................... 324/102 |
| 3,605,014 | A | * | 9/1971 | McCracken .................. 324/102 |
| 4,000,439 | A | * | 12/1976 | McCutcheon et al. ... 324/76.15 |
| 4,141,347 | A | * | 2/1979 | Green et al. ................. 348/163 |
| 4,263,548 | A | * | 4/1981 | Carlson et al. .............. 324/102 |
| 4,476,432 | A | * | 10/1984 | Olson ....................... 324/121 R |
| 5,256,968 | A | * | 10/1993 | Loualiche et al. ............ 324/96 |
| 5,444,459 | A | * | 8/1995 | Moriyasu ..................... 324/102 |

FOREIGN PATENT DOCUMENTS

| EP | 357440 | 3/1990 |
| JP | 5082606 | 4/1993 |

OTHER PUBLICATIONS

"A High–Impedance Probe Based On Electro–Optic Sampling" Proceeding of the 15th Meeting on Lightwave Technology, May 1995, pp 123–129.

* cited by examiner

*Primary Examiner*—Ernest Karlsen
(74) *Attorney, Agent, or Firm*—Darby & Darby

(57) ABSTRACT

The present invention relates to an electro-optic sampling oscilloscope. The delay circuit in the electro-optic sampling oscilloscope comprises a delay time detecting circuit, a regulation time determining circuit, a counter circuit and a delay regulating circuit. The delay time detecting circuit detects in the trigger signal a value corresponding to the delay time of a reference clock from a reference clock generating circuit. The regulation time determining circuit determines a regulation time based on the value detected by the delay time detecting circuit so that the regulation time is an integer multiple of the reference clock. The counter circuit is triggered by the trigger signal to count the reference clock through a specific value. The delay regulating circuit employs a signal related to the regulation time from the regulation time determining circuit, to delay the signal output from the counter circuit by the regulation time.

5 Claims, 7 Drawing Sheets

ELECTRO-OPTIC SAMPLING OSCILLOSCOPE

BACKGROUND OF THE INVENTION

1. Field of the Invention

The present invention is related to an electro-optic sampling oscilloscope which measures a signal to be measured by employing optical pulses generated based on a signal from a delay circuit in which a trigger signal is delayed in response to the measured position of the waveform of the signal to be measured. More particularly, the present invention relates to an electro-optic sampling oscilloscope characterized in having a delay circuit in which a trigger signal is delayed.

This application is based on patent application No.Hei 9-273158 filed in Japan, the content of which is incorporated herein by reference.

2. Background Art

It is possible to observe the waveform of a signal to be measured by coupling the electric field generated by the signals to be measured to an electro-optic crystal, causing laser light to enter this electro-optic crystal, and using the polarization state of the laser light. Here, it is possible to use this laser light in pulse form, and to conduct measurement with extremely high time resolution when the sampling of the signal to be measured is conducted. An electro-optic sampling oscilloscope employs an electro-optic probe which takes advantage of this phenomenon.

In comparison with conventional sampling oscilloscopes which employ electrical probes, such an electro-optic sampling oscilloscope herein below termed an "EOS" oscilloscope) has the following characteristic features (Shinagawa, et al: "A High-Impedance Probe Based on Electo-Optic Sampling," Proceeding of the 15$^{th}$ Meeting on Lightwave Sensing Technology, May 1995, pp 123–129):

(1) When signals are measured, a ground wire is not required, so that measurement is simplified.
(2) The metal pin which is at the lead end of the electro-optic probe is isolated from the circuit system, so that it is possible to realize a high input impedance, and as a result, the state at the point at which measurement is conducted is essentially free of fluctuations.
(3) Since optical pulses are employed, measurement is possible in a broad band up to the order of GHz.

The structure of an EOS oscilloscope will now be explained with reference to FIG. 4.

An EOS oscilloscope is composed of an EOS oscilloscope main body 1 and an electro-optic probe 2. In EOS oscilloscope main body 1, a trigger circuit 3 outputs a trigger signal which initiates measurement of the measurement signal. Delay circuit 4 then delays the signal from trigger circuit 3 by the time set by setting unit 9. Setting unit 9 is composed of switches and the like. The delay time set at setting unit 9 is set in delay circuit 4 via processing circuit 8. Timing generation circuit 5 generates the timing for generating the optical pulse and the timing for A/D conversion based on the signal from delay circuit 4. Optical pulse generating circuit 6 generates an optical pulse based on a timing signal from timing generation circuit 5.

The optical pulse from optical pulse outputting circuit 6 is supplied to electro-optic probe 2 and is subjected to polarization change by an electro-optic element. The optical pulse subjected to polarization change undergoes polarized light detection etc., by a polarized light detecting optical system (not shown) inside electro-optic probe 2, and that signal is input to EOS oscilloscope main body 1.

This signal is subjected to signal amplification or A/D conversion by A/D converter 7, and processing by processing circuit 8 for displaying the signal which is the target of measurement, an so on.

Next, FIG. 5 will be used to explain the reason for delaying the trigger signal from trigger circuit 3 using delay circuit 4. As shown in parts (a) and (b) in FIG. 5, the trigger signal from trigger circuit 3 is generated roughly in synchronization with the signal to be measured. In FIG. 5, the waveform from measurement point A1 or A2 is displayed on the display member (not shown) of EOS oscilloscope main body 1. The user of the EOS oscilloscope may not wish to display the waveform from measurement point A1 or A2, but rather may want to display the waveform from measurement point B1 or B2 which is slightly delayed from measurement point A1 or A2. In this way, delay circuit 4 is employed to shift the initial position of the display of the waveform.

For example, when the EOS oscilloscope user wants to display the waveform from measurement point B1 rather than measurement point A1, then setting unit 9 in FIG. 4 is set to delay the initial position of the display of the signal to be measured. The setting information is analyzed by processing circuit 8, delay time T' for measurement point B1 with respect to measurement point A1 is determined, and a delay time T' is set in delay circuit 4. As a result, as shown in part (c) in FIG. 5, delay circuit 4 outputs a trigger signal after delaying it by just delay time T'. Timing for sampling is then generated using the output from delay circuit 4.

FIG. 6 shows an example of one conventional structure for delay circuit 4. In FIG. 6, delay circuit 4 is composed of a lamp circuit 31 which designates the trigger signal as an input signal; a D/A converter 32 which converts the delay time setting signal from processing circuit 8 from a digital to an analog signal; and a comparing circuit 33 which compares the signal output from ramp circuit 31 and D/A converter 32.

The operation of the delay circuit shown in FIG. 6 will now be explained using FIG. 7.

As shown in part(a) in FIG. 7, when a trigger signal is input into ramp circuit 31, this signal is employed as a trigger for ramp circuit 31 to output a ramp signal as shown in part (c) in FIG. 7.

As shown in part (b) in FIG. 7, D/A converter 32 outputs an output signal in which the delay time setting signal from processing circuit 8 has been converted from a digital to an analog signal. When the value set from delay circuit 7 is delay time T', then D/A converter 32 outputs a signal which is higher than the reference level by just a component corresponding to the delay time T' only.

The outputs from ramp circuit 31 and D/A converter 32 are compared at comparing circuit 33, and a signal is output in which trigger signal has been delayed by just a time T', as shown in part(c) in FIG. 7.

Depending on the measured signal, a relatively long delay may be desirable, on the order of milli-seconds or seconds, for example. In the above-described delay circuit 4 for an EOS oscilloscope, a ramp signal from ramp circuit 31 is employed to carry out the setting of the delay time. However, when carrying out a long delay time in this way, the ability to reproduce the signal is not good due to the generation of a shift or fluctuation (jitter) in the ramp signal. In other words, a delay time on the order of milli-seconds or seconds cannot be set with good accuracy.

Depending on the measured signal, a relatively long delay may be desirable, on the order of milli-seconds [ms] or seconds [s], for example. In the above-described delay circuit 4 for an EOS oscilloscope, a lamp signal from lamp circuit 31 is employed to carry out the setting of the delay time. However, when carrying out a long delay time in this way, the ability to reproduce the signal is not good due to the generation of a shift or fluctuation (jitter) in the lamp signal. In other words, a delay time on the order of milli-seconds [ms] or seconds [s] cannot be set with good accuracy.

SUMMARY OF THE INVENTION

The present invention was conceived in consideration of the above-described circumstances, and has as its objective the provision of an electro-optic sampling oscilloscope in which it is possible to set a stable delay time even in the case where a relatively long delay time is being set.

Therefore, the present invention provides an electro-optic sampling oscilloscope having a delay circuit which comprises a delay time detecting circuit, a regulation time determining circuit, a counter circuit and a delay regulating circuit. The delay time detecting circuit detects in the trigger signal a value corresponding to the delay time of a reference clock from a reference clock generating circuit. The regulation time determining circuit determines a regulation time based on the value detected by the delay time detecting circuit so that the regulation time is an integer multiple of the reference clock. The counter circuit is triggered by the trigger signal to count the reference clock through a specific value. The delay regulating circuit employs a signal related to the regulation time from the regulation time determining circuit, to delay the signal output from the counter circuit by the regulation time.

In this manner, it is possible to realize a delay which is an integer multiple of the period of the reference clock stably and with excellent accuracy even in the case where a relatively long delay time is being set.

Furthermore, the invention provides the electro-optic sampling oscilloscope having the delay circuit to which a micro-regulation value is enable to set.

In this manner, it is possible to set a delay time even more finely than period of the reference clock.

This summary of the invention dose not necessarily describes all necessary features so that the invention may also be a sub-combination of these described features.

The reference symbols used in the claims are not any influences for the interpretation of the claims. (only for EP application)

DETAILED DESCRIPTION OF THE PREFERRED EMBODIMENTS

The following embodiments do not restrict the interpretation of the claims relating to the present invention, and the combination of all the features explained in the embodiments is always not being indispensable means of solving the problem.

An electro-oscilloscope according to one embodiment of the present invention will now be explained with reference to the figures.

Figure 4:
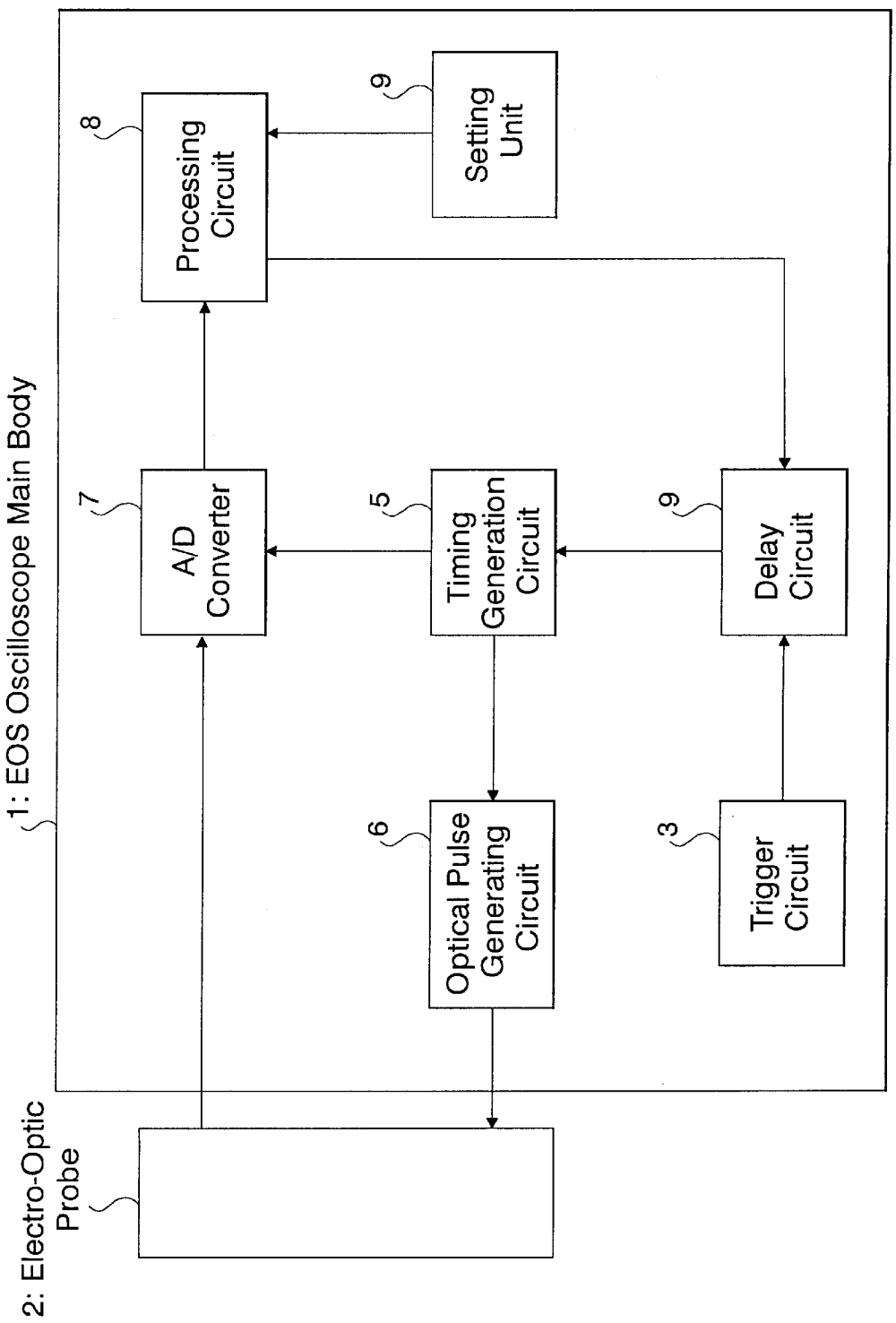
FIG. 4 is a diagram showing the structure of the EOS oscilloscope.
Figure 5:
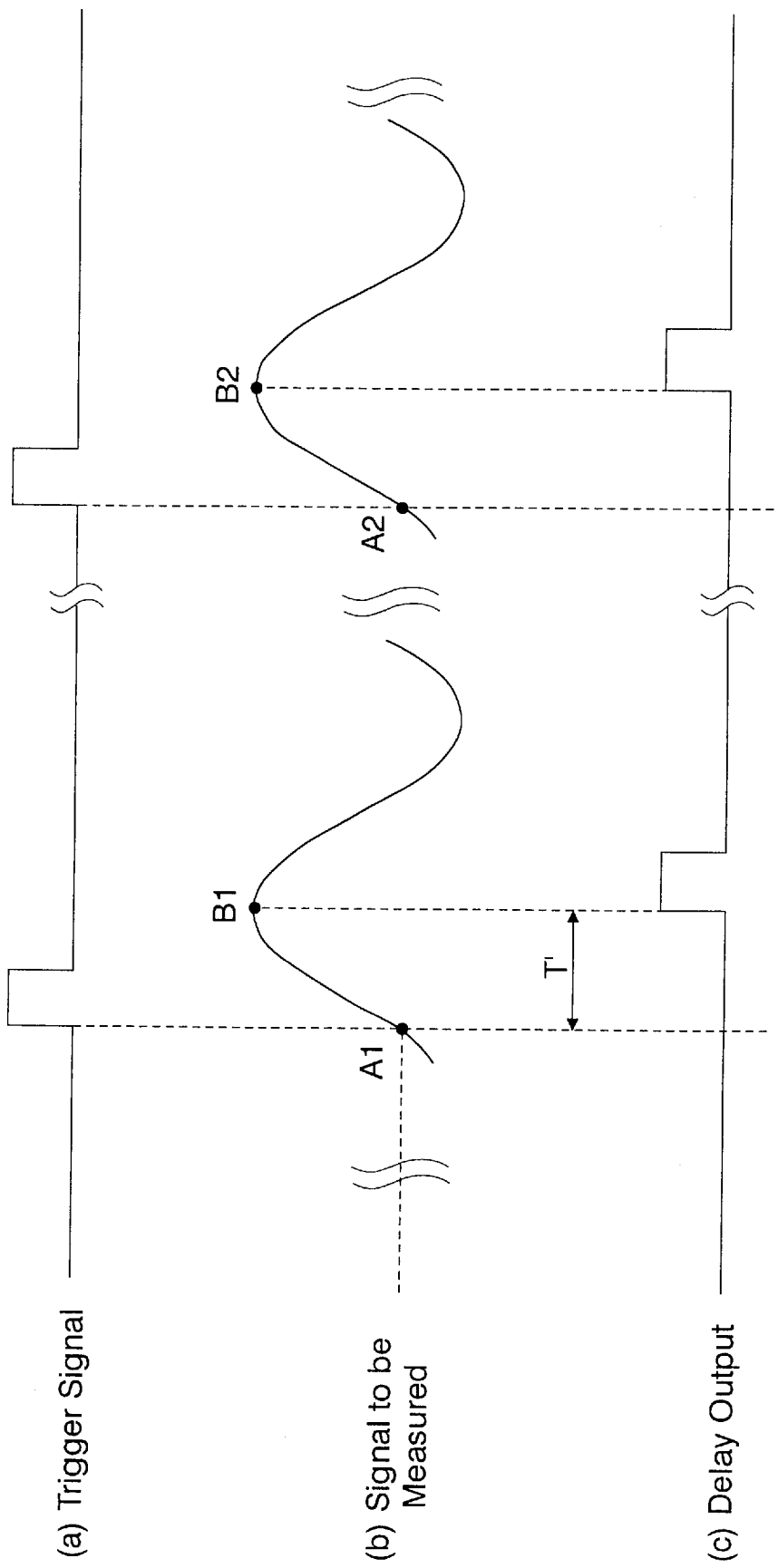
FIG. 5 is a diagram explaining the function of the delay circuit in the EOS oscilloscope.
Figure 6:
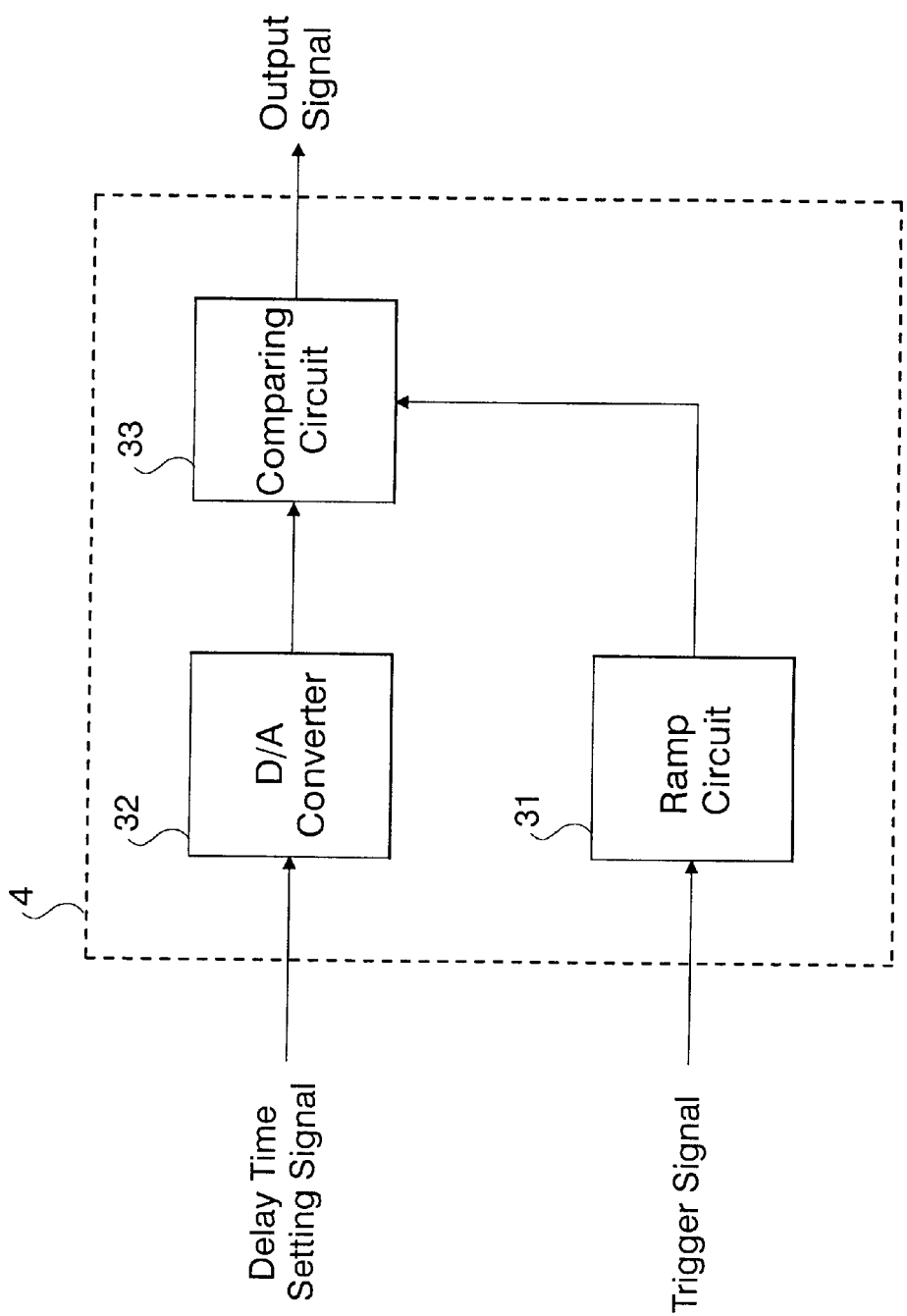
FIG. 6 is a figure showing the circuit structure in a conventional example of a delay circuit in an EOS oscilloscope.
Figure 7:
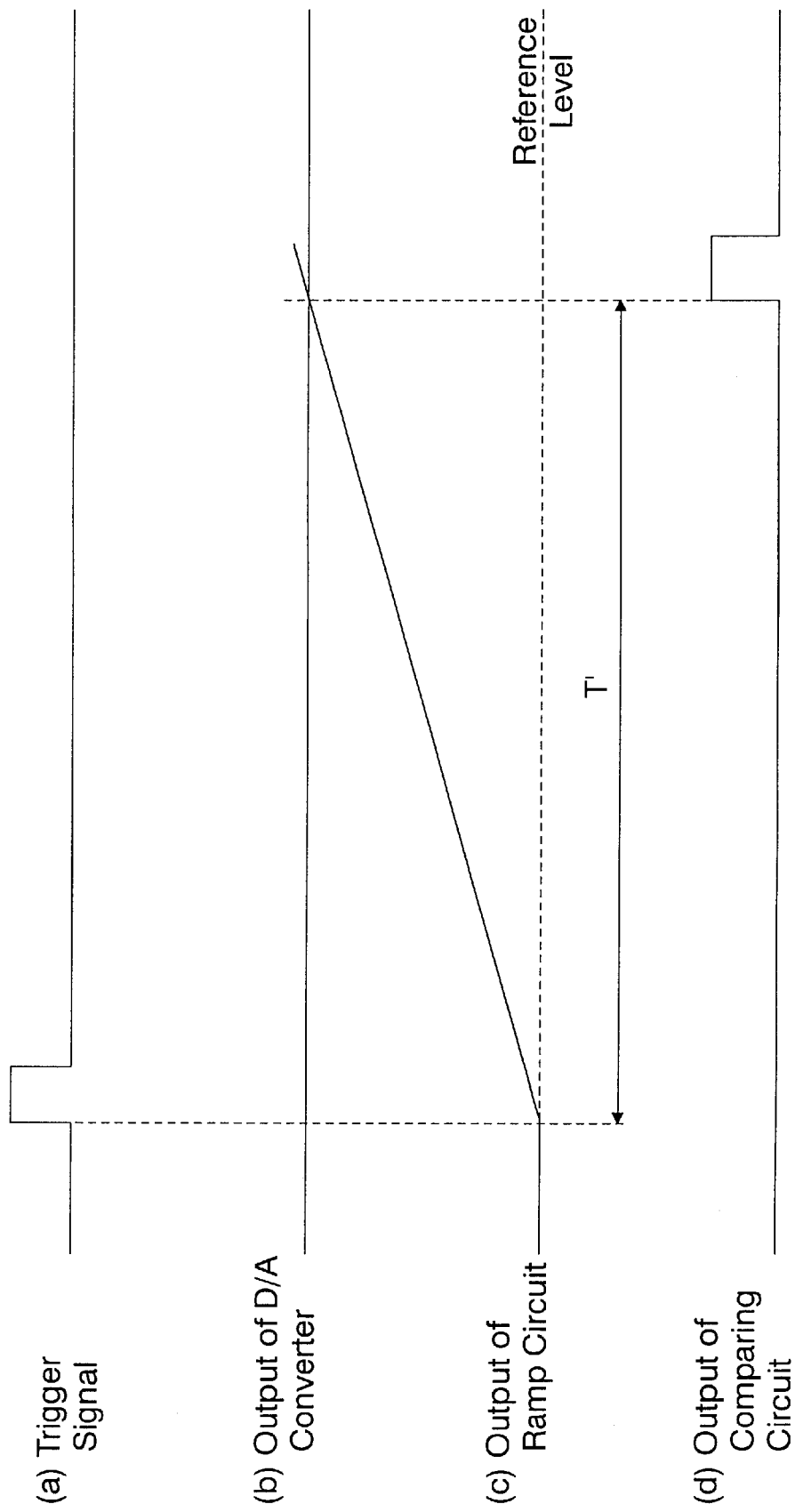
FIG. 7 is a diagram explaining the operation of the delay circuit of FIG. 6.

The structure of an EOS oscilloscope will first be explained with reference to FIG. 4. As discussed above, an EOS oscilloscope is composed of an EOS oscilloscope main body 1 and an electro-optic probe 2. The EOS oscilloscope main body is formed of a trigger circuit 3, delay circuit 4, timing generation circuit 5, optical pulse generating circuit 6, A/D converter 7, processing circuit 8, and setting unit 9.

In this EOS oscilloscope main body 1, trigger circuit 3 outputs a trigger signal which serves to initiate measurement of the measured signal. Delay circuit 4 delays the signal from trigger circuit 3 by just the time set in setting unit 9. Setting unit 9 is composed of switches and the like. The delay time set by setting unit 9 is set in delay circuit 4 via processing circuit 8. Timing generation circuit 5 generates the timing for generating the optical pulse and the timing for A/D conversion based on the signal from delay circuit 4. Optical pulse generating circuit 6 generates an optical pulse based on the timing signal from timing generation circuit 5.

The optical pulse from optical pulse generating circuit 6 is supplied to electro-optic probe 2 and undergoes polarization change by an electro-optic crystal. The optical pulse thus subjected to polarization change undergoes polarized light detection etc., by a polarized light detecting optical system (not shown) inside electro-optic probe 2, and that signal is input to EOS oscilloscope main body 1.

The signal from electro-optic probe 2 undergoes signal amplification and A/D conversion by A/D converter 7, and processing by processing circuit 8 for displaying the signal which is being measured.

Figure 1:
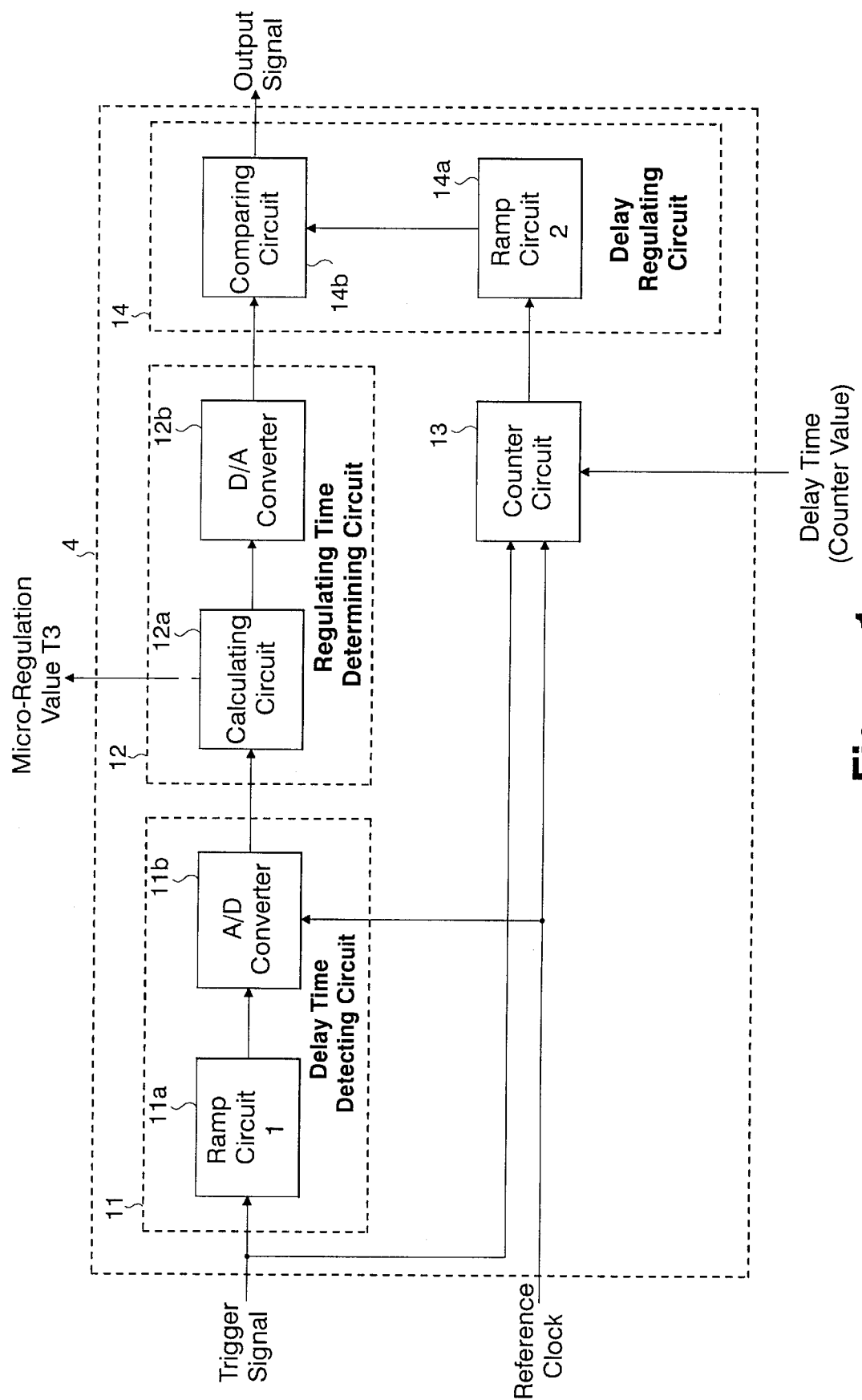
FIG. 1 is a circuit diagram of the delay circuit in the EOS oscilloscope according to one embodiment of the present invention.

Next, FIG. 1 will be used to explain the structure of delay circuit 4' in the EOS oscilloscope of this embodiment.

As shown in FIG. 1, the trigger signal from trigger circuit 3, and the reference clock from the reference clock generating circuit (not shown) inside the EOS oscilloscope, in addition to the delay time from processing circuit 8, are input as input signals to delay circuit 4'. On the other hand, the output signal is a signal which results when the trigger signal is delayed by just the set time. In addition to the signal input in this figure, a micro-regulation value T3 which is set via processing circuit 8 is also input, and it will be explained separately. Also, note that the trigger signal and the reference clock are generated by different circuits, and they are not in synchronization.

Delay circuit 4' is composed of delay time detecting circuit 11 which detects a value corresponding to the delay time between the asynchronous reference signal and trigger signal; a regulation time determining circuit 12 which determines the regulation time based on the value detected by delay time detecting circuit 11 so that the regulation time becomes an integer multiple of the period of the reference clock; a counter circuit 13 which counts the reference clock in response to the delay time set from processing circuit 7; and a delay regulating circuit 14 which further delays the time which has already been delayed by counter circuit 13 by the regulation time from regulation time determining circuit 12, and outputs a signal in which a trigger signal has been delayed by an integer multiple of the reference clock.

Delay time detecting circuit 11 is composed of a ramp circuit 1·11a which is triggered by a trigger signal to output a ramp waveform; and an A/D converter 11b which converts the lamp signal from ramp circuit 1•11a from an analog to a digital signal at the timing from the reference clock input immediately after the trigger signal.

Regulation time determining circuit 12 is composed of a calculating circuit 12a which determines the delay time T1 of the standard signal with respect to a trigger signal based on the output from delay time detecting circuit 11, and determines the regulation time T2 (=T−T1) by subtracting the thus-determined delay time T1 from the known period T of the reference clock so that the delay time due to delay circuit 4 becomes an integer multiple of period T of the reference clock; and a D/A converter 12b which converts the output from calculating circuit 12a from a digital to an analog signal.

Delay regulating circuit 14 is composed of a ramp circuit 2•14a which is triggered by the signal from container circuit 13 to output the ramp signal; and a comparing circuit 14b which outputs the signal which is the results of a further delay by a regulation time T2 of the signal from counter circuit 13, by comparing the signals from ramp circuit 2•14a and regulation time determining circuit 12.

Note that the term "EOS oscilloscope" used hereinafter indicates both the case where an electro-optic probe 2 is provided along with the EOS oscilloscope main body 1, as well as the case where only the EOS oscilloscope main body 1 is provided.

The operation of the delay circuit 4 shown in FIG. 1 will now be explained with reference to FIG. 2

Figure 2:
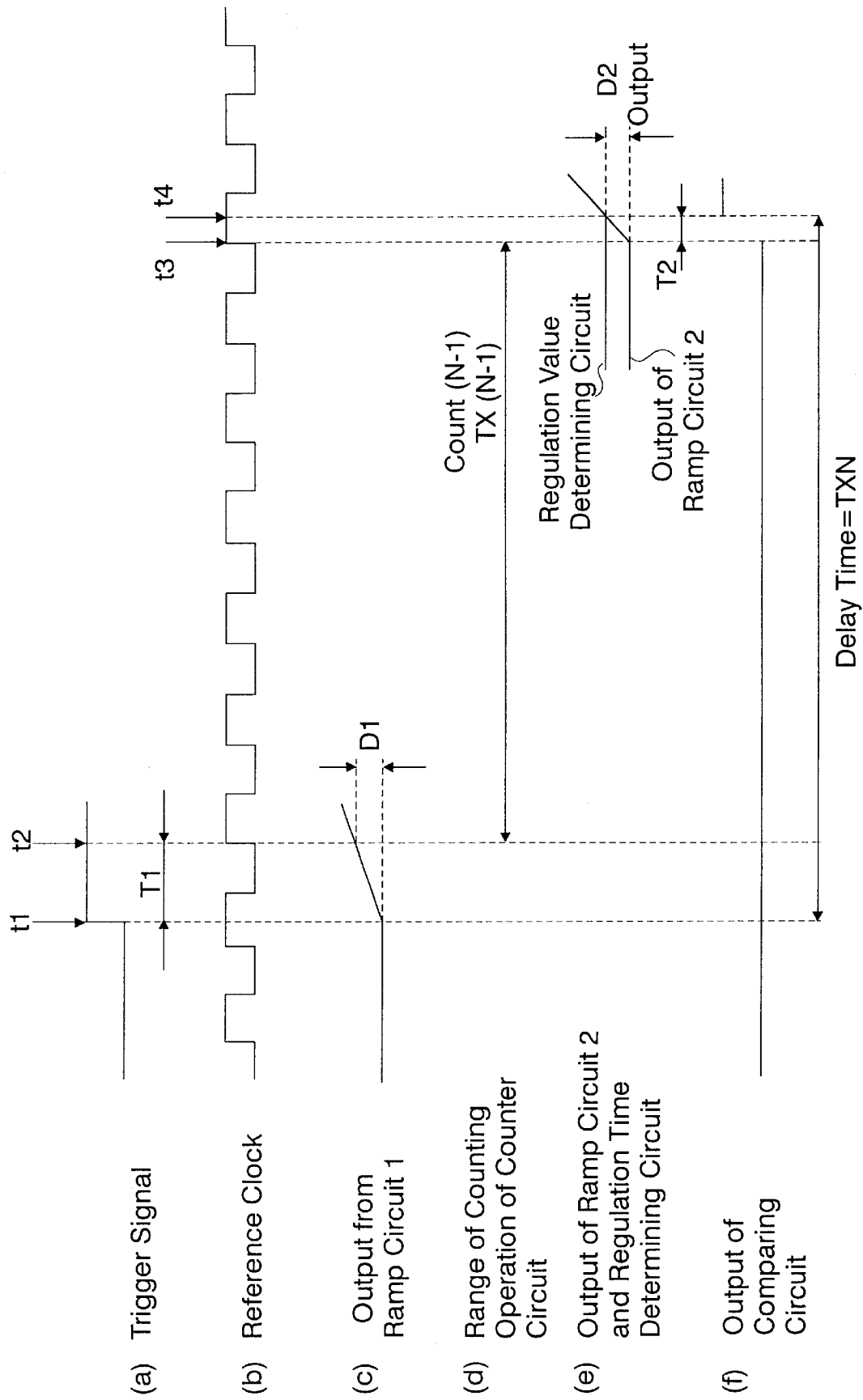
FIG. 2 is a diagram explaining the operation of the delay circuit in FIG. 1.

For the purpose of this discussion, a trigger signal such as shown in part (a) in FIG. 2 and a reference clock such as shown in part (b) in FIG. 2 are input to delay circuit 4. The frequency of the reference clock is defined here to be a relatively high frequency, such as megahertz (MHz) or kilohertz (KHz) order.

When a trigger signal is input at time t1, this signal triggers ramp circuit 1•11a to start outputting a ramp signal as shown in part(c) in FIG. 2.

Time t2 is defined to be the first rise in the reference clock following the input of the trigger signal. The value D1 output from ramp circuit 1•11a is converted from an analog to a digital signal by A/D converter 11b according to the timing of time t2. Because frequency of the reference clock is relatively high, the lamp signal from ramp circuit 1•11a is converted from an analog to a digital signal by A/D converter 11b within a range in which the ramp signal is stable.

Triggered by the input of the trigger signal, counter 13 counts the reference clock a number of times corresponding to the set delay time. When counting the reference clock, it is basically the rise in the signal which is counted. For example, if the count number determined by processing circuit 8 based on the delay time set by setting unit 9 in FIG. 4 is "N", then a count number "N−1", obtained by subtracting one period from the standard signal regulated by delay regulating circuit 14, is set in counter circuit 13. Counter circuit 13 then counts the reference clock for the count number "N−1" only, as shown in part (d) in FIG. 2.

At time t3, when the counting operation by counting circuit 13 is finished, counter 13 outputs a signal. This signal triggers ramp circuit 2•14a to output a ramp signal as shown in part (e) in FIG. 2.

Conversely, calculating circuit 12a, which has received the value D1 shown in part(c) in FIG. 2 from delay time detecting circuit 11, determines the delay time T1 (t2−t1) of the reference clock with respect to the trigger signal. Note that delay time T1 and value D1 has a proportional relationship. This proportion constant can be determined by ramp circuit 1•11a. Calculating circuit 12a stores the proportion constant which can be determined by ramp circuit 1•11a as known information. Calculating circuit 12a stores the period T of the reference clock as a known value, and calculates regulation time T2 employing:

$$T2=T-T1$$

The result of this calculation is converted by D/A converter 12b in response to the characteristics of ramp circuit 2•14a, and outputs a signal which is higher than the standard level by D2, as shown in part(e) in FIG. 2.

Comparing circuit 14b compares the signal from regulation time determining circuit 12 and the signal from ramp circuit 2•14a shown in part(e) in FIG. 2, and outputs a signal at a timing of time t4 which is obtained by delaying time t3, at which ramp circuit 2•14a receives the signal from counter circuit 13, by a further regulation time T2.

The sum of delay time T1 with respect to the trigger signal and the regulation time T2 determined by regulation time determining circuit 12 coincides to the period T of the reference clock. At counter circuit 13, the signal is output after counting the reference clock (N−1) times. Thus, the difference between time t1 at which the trigger signal was input and time t4 at which the signal from delay circuit 4 was output is $$t4-t1=T\times N$$

The trigger signal is output after delaying the reference clock by an integer multiple (N) using delay circuit 4.

Figure 3:
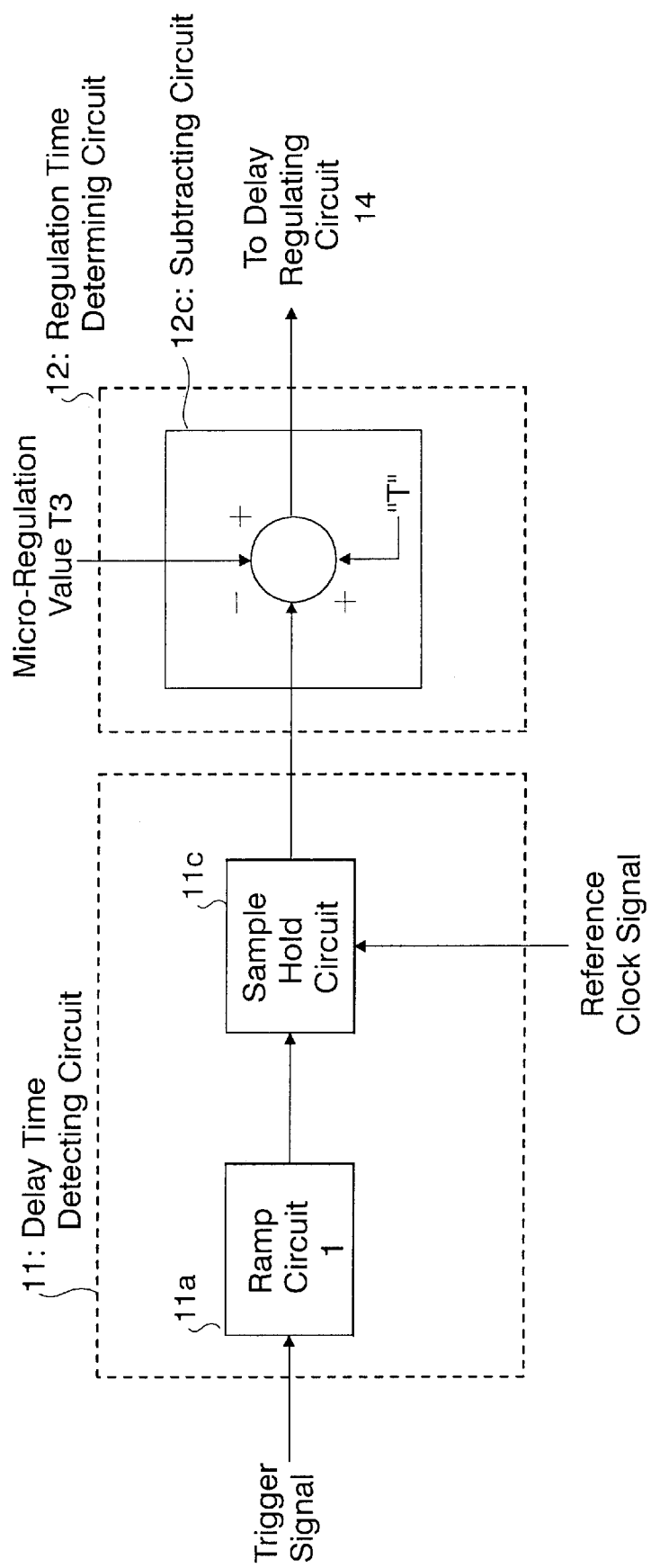
FIG. 3 is another circuit diagram of the delay time detecting circuit and the regulation time determining circuit in the delay circuit in FIG. 1.

In the delay circuit 4 shown in FIG. 1, delay time detecting circuit 11 and regulation time determining circuit 12 carry out intermediate processing using digital signals. The structures of a delay time detecting circuit 11 and regulation time determining circuit 12 in the case where this is all carried out in analog signals are shown in FIG. 3.

Delay time detecting circuit 11 is formed a lamp circuit 1•11a and a sample hold circuit 11c which holds the output from lamp circuit 1•11a at the timing of the rise in the reference clock immediately after the trigger signal is input. Regulation time determining circuit 12 is formed of a subtracting circuit 12c which subtracts the signal level from sample hold circuit 11c from the signal level responding to the period T of the reference clock. The output from this subtracting circuit 12c is input to delay regulating circuit 14 as the signal related to regulation time T2.

As explained above lamp circuit 1•11a forming delay time detecting circuit 11 and ramp circuit 2•14a forming delay regulation circuit 14 are employed within a range in which the signal is stable, so that detection of the delay time and delay of the signal from counter circuit 13 can be carried out with excellent accuracy. Further, even in the case of a long delay time, setting of the delay time is mainly carried out by counter circuit 13 so that it is possible to realize with excellent accuracy a delay which is an integer multiple of the period of the reference clock.

In FIG. 1, micro-regulation value T3 ($0 \leq T3 \leq T$, where T is the period of the reference clock) set by setting unit 9 is input to calculating circuit 12a via processing circuit 7. A design is also acceptable in which this micro-regulation value T3 is used so that calculating circuit 12a determines regulation time T2 according to $$T2=T-T1+T3$$

As a result, it is possible to set the delay time even more finely than reference clock period T.

Similarly, a level signal corresponding to micro-regulation value T3 is input to subtracting circuit 12c shown in FIG. 3. Subtracting circuit 12c adds this signal as well, so that it is possible to set the delay time even more finely than period T of the reference clock.

In this embodiment, regulation time determining circuit 12 inside delay circuit 4 preferably defines a s ingle period "T" of the reference clock as the standard, and determines regulation time T2. However, the present invention is not limited there to. Rather, regulation time T2 may also be determined by taking an integer multiple of period T as the standard within the range in which the ramp signal from ramp circuit 2•14a is stable.

In the explanation of micro-regulation value T3 which is input to regulation time determining circuit 12, the desirable range was defined to be within a single period T of the reference clock, however, the present invention is not limited thereto.

In the above-described delay circuit 4, it is also acceptable to delay not only the trigger signal, but also to carry out delay processing on signals which must be delayed inside the EOS oscilloscope.

As explained above, the following effects are obtained as a result of the electro-optic sampling oscilloscope of the present invention.

Ramp circuit 1•11a forming the delay time detecting circuit 11 and ramp circuit 2•14a forming the delay regulation circuit 14 are employed within the range in which the ramp waveform is stable, so that the detection of the delay time and the delay of the signal from counter circuit 13 can be carried out with excellent accuracy. Further, because the setting of the delay time is mainly carried out by counter circuit 13, it is possible to realize a delay which is an integer multiple of the period of the reference clock stably and with excellent accuracy.

Further, by enabling the setting of a micro-regulation value T3 in delay circuit 4, it is possible to set a delay time even more finely than period T of the reference clock.

What is claimed is:

1. In an electro-optic sampling oscilloscope which a reference clock and a delay circuit for delaying a trigger signal by a predetermined delay time and measures a signal to be measured by employing optical pulses that are generated based on the delayed trigger signal, said delay circuit comprising:

a delay time detecting circuit which detects a clock delay time between said trigger signal and a next occurring period of said reference clock;

a regulating time determining circuit which determines a regulating time based on said clock delay time so that said delay time is an integer multiple of one period of said reference clock;

a counter circuit which counts said reference clock until a number that is one less than said integer multiple, when said trigger signal occurs; and a delay regulating circuit which outputs a delayed trigger signal following said regulating time, after the counting by said counter circuit is ended.

2. An electro-optic sampling oscilloscope according to claim 1, wherein said delay time detecting circuit comprises:

a ramp circuit which outputs a ramp waveform, when said trigger signal is inputted into said ramp circuit; and a sample hold circuit which holds the output from said ramp circuit as a signal level that designates said clock delay time, when said reference clock becomes active after inputting of said trigger signal.

3. An electro-optic sampling oscilloscope according to claim 2, wherein said regulating time determining circuit determines said regulating time by subtracting said clock delay time from one period of said reference clock.

4. An electro-optic sampling oscilloscope according to claim 1, wherein said regulating time determining circuit determines said regulating time by subtracting said clock delay time from one period of said reference clock.

5. An electro-optic sampling oscilloscope according to claim 1, wherein said delay regulating circuit comprises:

a ramp circuit which outputs a lamp waveform, when the counting by said counter circuit is ended; and a comparing circuit which compares an output from said lamp circuit with a signal level that designates said regulating time, and outputs said delayed trigger signal when the former becomes more than or equal to the latter.

* * * * *